US008791505B2

(12) United States Patent
Kinoshita et al.

(10) Patent No.: US 8,791,505 B2
(45) Date of Patent: Jul. 29, 2014

(54) SEMICONDUCTOR DEVICE

(71) Applicant: Panasonic Corporation, Osaka (JP)

(72) Inventors: Yusuke Kinoshita, Kyoto (JP); Satoshi Tamura, Osaka (JP); Yoshiharu Anda, Osaka (JP); Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/788,288

(22) Filed: Mar. 7, 2013

(65) Prior Publication Data

US 2013/0193486 A1    Aug. 1, 2013

Related U.S. Application Data

(63) Continuation of application No. PCT/JP2011/002293, filed on Apr. 19, 2011.

(30) Foreign Application Priority Data

Oct. 29, 2010    (JP) .................................. 2010-243769

(51) Int. Cl.
*H01L 29/66* (2006.01)

(52) U.S. Cl.
USPC ........................................... 257/194; 257/14

(58) Field of Classification Search
USPC .................................. 257/194, 14
See application file for complete search history.

(56) References Cited

U.S. PATENT DOCUMENTS

| 7,462,891 | B2 | 12/2008 | Brar et al. |
| 2003/0098462 | A1 | 5/2003 | Yoshida |
| 2005/0087763 | A1 | 4/2005 | Kanda et al. |
| 2007/0051938 | A1* | 3/2007 | Otsuka et al. .................... 257/14 |
| 2007/0051978 | A1 | 3/2007 | Mita et al. |
| 2007/0210335 | A1* | 9/2007 | Ikeda et al. .................... 257/201 |
| 2007/0284653 | A1* | 12/2007 | Ueno et al. .................... 257/324 |
| 2010/0207164 | A1 | 8/2010 | Shibata et al. |
| 2011/0095337 | A1 | 4/2011 | Sato |

FOREIGN PATENT DOCUMENTS

| JP | 2002-016245 | 1/2002 |
| JP | 2004-031896 | 1/2004 |
| JP | 2005-129696 | 5/2005 |
| JP | 2007-053185 | 3/2007 |
| JP | 2007-305954 | 11/2007 |

OTHER PUBLICATIONS

International Search Report of PCT Application No. PCT/JP2011/002293 dated Aug. 2, 2011.

* cited by examiner

*Primary Examiner* — Douglas Menz
(74) *Attorney, Agent, or Firm* — McDermott Will & Emery LLP

(57) ABSTRACT

A semiconductor device includes: a second nitride semiconductor layer formed on a first nitride semiconductor layer, and having a larger band gap than the first nitride semiconductor layer; and an electrode filling a recess formed in the first and second nitride semiconductor layers. The first nitride semiconductor layer has a two-dimensional electron gas layer immediately below the second nitride semiconductor layer. The electrode and the second nitride semiconductor layer are in contact with each other at a first contact interface. The electrode and a portion of the first nitride semiconductor layer corresponding to the two-dimensional electron gas layer are in contact with each other at a second contact interface connected below the first contact interface. The first contact interface is formed such that a width of the recess increases upward. The second contact interface is more steeply inclined than the first contact interface.

13 Claims, 8 Drawing Sheets

SEMICONDUCTOR DEVICE

CROSS-REFERENCE TO RELATED APPLICATIONS

This is a continuation of International Application No. PCT/JP2011/002293 filed on Apr. 19, 2011, which claims priority to Japanese Patent Application No. 2010-243769 filed on Oct. 29, 2010. The entire disclosures of these applications are incorporated by reference herein.

BACKGROUND

Nitride semiconductors represented by, e.g., gallium nitride (GaN) have advantages, such as a high breakdown voltage, a high electron saturation velocity, and high electron mobility due to their wide band gaps, and another advantage, such as a high electron density in a heterojunction. Thus, nitride semiconductors have been studied and developed in order to be used for, e.g., high-breakdown-voltage power electronic devices, or high-speed devices for the millimeter wave band.

In particular, heterojunction structures in which nitride semiconductor layers having different band gaps are laminated together, or quantum well structures or superlattice structures in which a plurality of such heterojunction structures are laminated together are capable of controlling the degree of modulation of the electron density in a device, and thus, have been utilized as principal structures of devices using nitride semiconductors.

Examples of semiconductor devices having a heterojunction structure and using nitride semiconductors include a heterojunction field-effect transistor (HFET) (see, for example, Japanese Patent Publication No. 2002-16245 (Document 1)).

The HFET includes, for example, an operation layer formed on a substrate, and made of GaN, a barrier layer made of undoped aluminum gallium nitride (AlGaN), and source, drain, and gate electrodes formed on the barrier layer.

AlGaN has a larger band gap than GaN. Thus, electrons resulting from the difference between the amount of spontaneous polarization of AlGaN and that of GaN and the difference between the amount of piezoelectric polarization of AlGaN and that of GaN, electrons resulting from n-type impurities with which the barrier layer is doped as required, electrons resulting from other uncontrollable defects in the semiconductor layers, and other electrons are densely accumulated at the heterojunction interface between the operation layer and the barrier layer to form a two-dimensional electron gas (2DEG) layer thereat. Electrons in the 2DEG layer function as channel carriers through a field-effect transistor.

When a cathode (ohmic) electrode and an anode electrode are each formed on a structure of nitride semiconductor layers laminated together to form a heterojunction interface, this provides a Schottky barrier diode (SBD) in which electrons in a 2DEG layer function as channel carriers through the diode (see, for example, Japanese Patent Publication No. 2004-31896 (Document 2)).

In order to use semiconductor devices using nitride semiconductors as high-breakdown-voltage power electronic devices, or high-speed devices for the millimeter wave band, the on-resistance needs to be reduced. Principal factors responsible for the on-resistance include the sheet resistance of a channel layer and the contact resistance between an electrode and a semiconductor layer.

For example, in typical HFETs and SBDs, the contact resistance is increased for the following reason. Specifically, source/drain electrodes and a cathode electrode are formed on an undoped AlGaN layer. In this case, electrons must travel beyond the potential barrier of the undoped AlGaN layer, and reach a 2DEG layer. Consequently, the contact resistance is increased.

In order to reduce the contact resistance, for example, the distance between each of the electrodes and the 2DEG layer is selectively reduced. In order to selectively reduce the distance, a portion of an AlGaN barrier layer or the entire AlGaN barrier film is removed to form a contact portion having an inclined bottom or side surface and having a recessed cross section, and an ohmic electrode is formed on the contact portion (see, for example, Japanese Patent Publication No. 2005-129696 (Document 3), and Japanese Patent Publication No. 2007-053185 (Document 4)).

In the structure of Document 3, an AlGaN layer includes an inclined contact portion. With this structure, the electron gas concentration in a portion of the 2DEG layer immediately below the contact portion and the distance from the bottom of the contact portion to the 2DEG layer, which have conventionally been in a trade-off relationship, can each be any value. Consequently, ohmic contact can be provided in a region of the AlGaN layer where the contact resistance and the electron gas concentration are optimized.

In the structure of Document 4, a recess is formed to pass through an AlGaN layer, cross the heterojunction interface, and have a side surface which is inclined at the depth of the heterojunction interface. With this structure, not only ohmic contact through the AlGaN layer between each of the electrodes and the 2DEG layer, but also direct contact therebetween on the side surface of the recess can be provided to reduce the contact resistance.

SUMMARY

However, the above-described structures provide an inadequate amount of reduction in the contact resistance, and thus, the contact resistance needs to be further reduced.

Therefore, a semiconductor device using nitride semiconductors and including an ohmic electrode which can further reduce the contact resistance will be described hereinafter.

The inventors of this application studied the reason why the amount of reduction in the contact resistance is inadequate.

Among the above-described structures, the structure in which the AlGaN layer includes an inclined contact portion allows all of electrons passing through a portion of the electrode being in ohmic contact with the AlGaN layer to flow through the potential barrier of the AlGaN layer. This causes the amount of reduction in the contact resistance to be inadequate.

Alternatively, in the structure in which the recess is formed to pass through the AlGaN layer and have a side surface which is inclined at the depth of the heterojunction interface, the GaN layer includes an inclined contact portion, and thus, with increasing depth of the recess, the distance between the 2DEG layer and a portion of each of the electrodes below the 2DEG layer and on the contact portion of the GaN layer increases. Consequently, the contact resistance through the GaN layer between each of the electrodes and the 2DEG layer increases.

Based on the finding, a semiconductor device of the present disclosure includes: a first nitride semiconductor layer; a second nitride semiconductor layer formed on the first nitride semiconductor layer, and having a larger band gap than the first nitride semiconductor layer; and an ohmic electrode formed to fill a recess which passes through the second nitride semiconductor layer, and is formed such that the first nitride semiconductor layer is recessed. A two-dimensional electron gas layer is formed in a portion of the first nitride semiconductor layer immediately below an interface between the first and second nitride semiconductor layers, the ohmic electrode and the second nitride semiconductor layer are in contact with each other at least a first contact interface being a portion of a side surface of the recess, the ohmic electrode and a portion of the first nitride semiconductor layer corresponding to the two-dimensional electron gas layer are in contact with each other at least a second contact interface being a portion of the side surface of the recess and connected below the first contact interface, the first contact interface is formed such that a width of the recess increases from a lower surface of the second nitride semiconductor layer to an upper surface thereof, and the second contact interface is more steeply inclined with respect to a top surface of the first nitride semiconductor layer than the first contact interface in a vicinity of a joint between the first and second contact interfaces.

Since such a semiconductor device has a first contact interface allowing the width of the ohmic electrode to increase toward the upper surface of the second nitride semiconductor layer, the distance between the first contact interface of the ohmic electrode and a portion of the first nitride semiconductor layer immediately below the first contact interface can vary. This can reduce the contact resistance through the second nitride semiconductor layer therebetween, and provide a suitable (e.g., most suitable) region of the second nitride semiconductor layer in which the concentration of two-dimensional electron gas is adequate.

Furthermore, the second contact interface is connected to the first contact interface so as to be more steeply inclined with respect to the top surface of the second nitride semiconductor layer than the first contact interface, and the ohmic electrode and the two-dimensional electron gas layer are in contact with each other at the second contact interface. This can reduce the distance between a portion of the ohmic electrode below the two-dimensional electron gas layer (2DEG layer) and the two-dimensional electron gas layer, and can reduce the contact resistance through the first nitride semiconductor layer therebetween.

The first contact interface may have a plane forming a predetermined angle with respect to the top surface of the first nitride semiconductor layer, and the second contact interface may have a plane forming a steeper angle with respect to the top surface of the first nitride semiconductor layer than the predetermined angle.

At least one portion of the first contact interface may be curved toward the second nitride semiconductor layer.

The first contact interface may have such a shape as described above.

The second contact interface may be perpendicular to the top surface of the first nitride semiconductor layer.

This can further reduce the distance between a portion of the ohmic electrode below the two-dimensional electron gas layer and the two-dimensional electron gas layer, and can further reduce the contact resistance through the first nitride semiconductor layer therebetween.

At least one portion of the second contact interface may be curved toward the first nitride semiconductor layer.

In other words, a portion of the interface at which the ohmic electrode and the first nitride semiconductor layer are in contact with each other, or the entire interface may be curved.

The first contact interface may be formed to extend from the upper surface of the second nitride semiconductor layer and reach the lower surface thereof.

This enables utilization of the thickness of the entire second nitride semiconductor layer in order to obtain a suitable (e.g., most suitable) region which reduces the contact resistance through the second nitride semiconductor layer between the first contact interface and the two-dimensional electron gas layer, and in which the concentration of two-dimensional electron gas is adequate.

The second nitride semiconductor layer may have a layered structure made of a plurality of different nitride semiconductor layers.

The second nitride semiconductor layer may include a third nitride semiconductor layer into which conductive impurities are introduced.

This can reduce the potential barrier at the interface between the nitride semiconductor layer containing conductive impurities and the ohmic electrode, and can further reduce the contact resistance.

The second nitride semiconductor layer may include a fourth nitride semiconductor layer into which impurities are not introduced, and the third nitride semiconductor layer may be formed on the fourth nitride semiconductor layer.

Thus, since conductive impurities are not introduced into the fourth nitride semiconductor layer, this prevents interruption of the travel of electrons due to ion scattering in the two-dimensional electron gas layer. This prevention can improve the operating characteristics of the semiconductor device.

An AlN layer may be formed between the first and second nitride semiconductor layers.

The ohmic electrode may include two ohmic electrodes spaced apart from each other, and a gate electrode may be formed on a region of the second nitride semiconductor layer between the two ohmic electrodes.

Thus, the semiconductor device functions as a heterojunction field-effect transistor using two ohmic electrodes as a source electrode and a drain electrode.

Furthermore, the contact resistance can be reduced.

The semiconductor device may further include an anode electrode formed at a location different from a location of the ohmic electrode, and being in Schottky contact with the second nitride semiconductor layer.

Thus, the semiconductor device functions as a Schottky barrier diode using an ohmic electrode as a cathode electrode. Furthermore, the contact resistance can be reduced.

The semiconductor device may further include a cap layer made of a nitride semiconductor and formed on the second nitride semiconductor layer.

A portion of the second contact interface may be below the two-dimensional electron gas layer.

This can ensure contact between the second contact interface and the two-dimensional electron gas layer.

According to the semiconductor device of the present disclosure, a semiconductor device which includes an ohmic electrode providing low contact resistance, and uses a nitride semiconductor layer can be achieved.

DETAILED DESCRIPTION

First Embodiment

Figure 1:
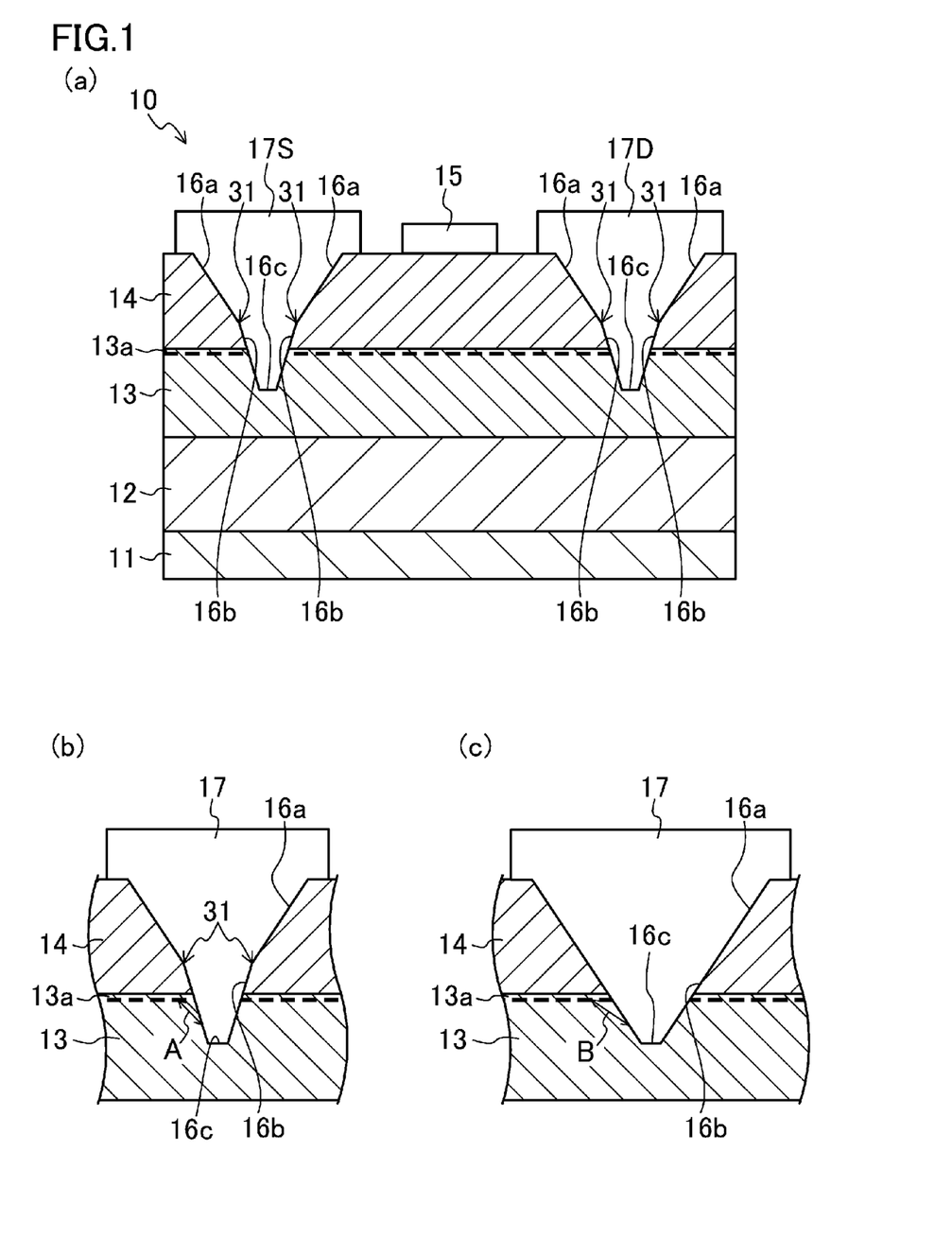
FIG. 1A is a diagram illustrating a cross-sectional configuration of an example semiconductor device (HFET) according to a first embodiment of the present disclosure.
FIGS. 1B and 1C are diagrams for explaining advantages of the example semiconductor device.

A first embodiment of the present disclosure will be described with reference to the drawings. FIG. 1A is a diagram schematically illustrating a cross section of an example semiconductor device 10 according to this embodiment.

The semiconductor device 10 is a heterojunction field-effect transistor (HFET). With the structure of the semiconductor device 10, an about 1-μm-thick buffer layer 12 made of aluminum nitride (AlN) or gallium nitride (GaN) is formed on a substrate 11 made of, e.g., silicon (Si). An about 1-μm-thick first nitride semiconductor layer 13 having a low density of n-type carriers and made of gallium nitride (GaN) (i.e., of an i type) is formed on the buffer layer 12. An about 25-nm-thick second nitride semiconductor layer 14 made of i-type aluminum gallium nitride ($Al_{0.26}Ga_{0.74}N$) is formed on the first nitride semiconductor layer 13.

Here, $Al_{0.26}Ga_{0.74}N$ forming the second nitride semiconductor layer 14 has a higher electron band gap energy than GaN forming the first nitride semiconductor layer 13. For this reason, a 2DEG layer (two-dimensional electron gas layer) 13a is formed in a portion of the first nitride semiconductor layer 13 in the vicinity of the interface between the first and second nitride semiconductor layers 13 and 14 (more specifically, e.g., immediately below the interface and to a depth of about 10 nm from the interface).

A gate electrode 15 is formed on the second nitride semiconductor layer 14 to be in Schottky contact with the second nitride semiconductor layer 14, and is made of, e.g., a multilayer film of nickel (Ni) and gold (Au). Recesses passing through the second nitride semiconductor layer 14 are formed laterally outward from the gate electrode 15 by removing portions of the second nitride semiconductor layer 14 and portions of an upper portion of the first nitride semiconductor layer 13, and a source electrode 17S and a drain electrode 17D (which may be hereinafter collectively referred to as electrodes 17) are formed to fill the recesses. The electrodes 17 are each made of, e.g., a multilayer film of titanium (Ti) and aluminum (Al), and are ohmic.

Each of the electrodes 17 is in contact with the second nitride semiconductor layer 14 at least first contact interfaces 16a. The first contact interfaces 16a correspond to sidewalls of a corresponding one of the recesses, and are inclined surfaces forming a predetermined angle with respect to the top surface of the first nitride semiconductor layer 13. Second contact interfaces 16b are connected at joints 31 below the first contact interfaces 16a, and the electrode 17 and the 2DEG layer 13a are in contact with each other at the second contact interfaces 16b. Angular portions of the second nitride semiconductor layer 14 protruding toward the electrode 17 are formed at the joints 31 by the first and second contact interfaces 16a and 16b, and the second contact interfaces 16b are steeper than the first contact interfaces 16a. Therefore, a surface formed by a corresponding pair of the first and second contact interfaces protrudes in a direction opposite to the first nitride semiconductor layer 13 at a corresponding one of the joints 31. The electrode 17 is bent inward in the vicinity of the joints 31.

Furthermore, each of the recesses has a third contact interface 16c corresponding to the bottom of the recess parallel to the top surface of the second nitride semiconductor layer 14, and a corresponding one of the electrodes 17 is in contact with the first nitride semiconductor layer 13 at the third contact interface 16c.

Such a configuration as described above can reduce the contact resistance.

First, each of the first contact interfaces 16a at which a corresponding one of the electrodes 17 is in contact with the second nitride semiconductor layer 14 is inclined with respect to the top surface of the first nitride semiconductor layer 13. This provides a region of the second nitride semiconductor layer 14 where the electron gas concentration in a portion of the 2DEG layer 13a under the first contact interface 16a and the distance from the first contact interface 16a to the 2DEG layer 13a are suitable (e.g., most suitable), thereby reducing the contact resistance and improving the device characteristics.

Since the second contact interfaces 16b are steeper than the first contact interfaces 16a, this can reduce the distance between the 2DEG layer 13a and a portion of each of the electrodes 17 below the 2DEG layer, and can reduce the contact resistance through the first nitride semiconductor layer 13 therebetween.

This is illustrated in FIGS. 1B and 1C. FIG. 1B is an enlarged view illustrating a region of the semiconductor device 10 of this embodiment surrounding one of the electrodes 17, and FIG. 1C is a diagram illustrating a semiconductor device of a comparative example having a first contact interface 16a, and a second contact interface 16b which is inclined at the same angle as the angle at which the first contact interface 16a is inclined.

Current paths between the 2DEG layer 13a and each of the electrodes 17 include a path of current flowing through the second contact interface 16b at the depth of the 2DEG layer 13a, and a path of current flowing through the first nitride semiconductor layer 13 between a portion of the second contact interface 16b below the 2DEG layer 13a and the electrode 17.

For example, the distance A between a portion of each of the electrodes 17 below the 2DEG layer 13a and the 2DEG layer 13a in the semiconductor device 10 is shorter than the equivalent distance B in the comparative example as illustrated in FIGS. 1B and 1C. Therefore, the distance over which electrons travel through the first nitride semiconductor layer 13 in the semiconductor device 10 is shorter than that in the comparative example, and thus, the contact resistance is reduced.

Next, a method for fabricating a semiconductor device 10 will be described with reference to FIGS. 2A-2D illustrating process steps in the method.

Figure 2:
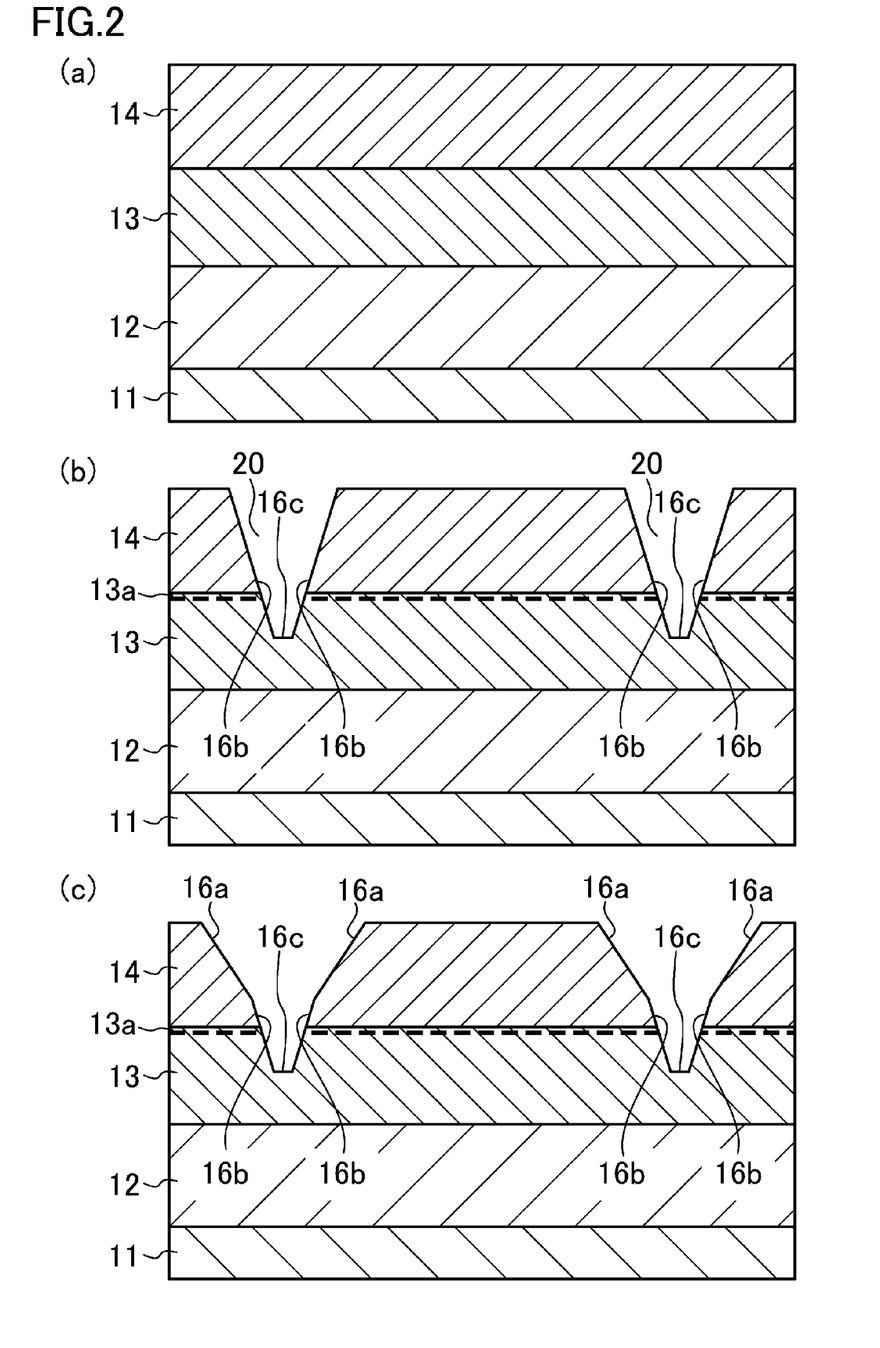
FIGS. 2A-2C are diagrams for explaining a method for fabricating the example semiconductor device according to the first embodiment.

First, a layered structure illustrated in FIG. 2A is formed. Specifically, a buffer layer 12 made of aluminum nitride or gallium nitride, a first nitride semiconductor layer 13 made of i-type gallium nitride, and a second nitride semiconductor layer 14 made of i-type aluminum gallium nitride ($Al_{0.26}Ga_{0.74}N$) are sequentially formed on a substrate 11 made of silicon. In order to form the layered structure, for example, metal organic chemical vapor deposition (MOCVD) is used. Alternatively, molecular beam epitaxy (MBE) may be used.

The second nitride semiconductor layer 14 has a higher band gap energy than the first nitride semiconductor layer 13, and thus, a 2DEG layer 13a is formed.

Next, as illustrated in FIG. 2B, etching is performed by lithography and dry etching using a chlorine gas with a predetermined resist pattern (not shown) as a mask. Thus, the first and second nitride semiconductor layers 13 and 14 are etched to a depth below the 2DEG layer 13a, and two recesses 20 are formed to each have a bottom corresponding to a third contact interface 16c, and sidewalls inclined at the same angle as the angle at which second contact interfaces 16b are inclined. The recesses 20 are a predetermined distance apart from each other to correspond to a source electrode 17S and a drain electrode 17D.

Furthermore, as illustrated in FIG. 2C, etching is performed by lithography and dry etching using a chlorine gas with a predetermined resist pattern (not shown) as a mask. Thus, portions of the second contact interfaces 16b corresponding to the sidewalls of the recesses are removed to form first contact interfaces 16a which are more gently inclined than the second contact interfaces 16b.

Here, in order to incline the sidewalls of each of the recesses by etching, an opening (corresponding to the recess) of the resist pattern is formed to have an inclined sidewall in a depth direction. Specifically, pattern exposure may be performed by overdosing. Alternatively, heat treatment may be performed after usual patterning.

The order in which the process step in FIG. 2B and the process step in FIG. 2C are performed may be inverted. Specifically, recesses having sidewalls which are inclined to correspond to the first contact interfaces 16a may be formed earlier, and then, portions of the layered structure below the recesses may be further etched to form the second and third contact interfaces 16b and 16c.

Next, electrodes 17 (a source electrode 17S and a drain electrode 17D) and a gate electrode 15 are formed, thereby fabricating a semiconductor device 10 in FIG. 1A.

In order to fabricate the semiconductor device 10, a resist pattern (not shown) having openings configured to expose the recesses 20 is first formed on the second nitride semiconductor layer 14 by lithography. Next, an electrode formation film made of a multilayer film of titanium and aluminum is formed, for example, by electron beam deposition, and then, a source electrode 17S and a drain electrode 17D are formed by lift-off.

Subsequently, a resist pattern (not shown) is formed to have an opening in a region where a gate electrode 15 is formed, and a gate electrode formation film made of nickel and gold is formed, for example, by electron beam deposition. Thereafter, a gate electrode 15 is formed by lift-off.

The gate electrode 15 may be formed earlier, and then, the source electrode 17S and the drain electrode 17D may be formed.

(Variations)

Next, other example configurations of each of cross-sectional profiles formed by first and second contact interfaces 16a and 16b which are ohmic contact regions will be described with reference to FIGS. 3-5. All of the configurations reduce the contact resistance similarly to the semiconductor device 10 illustrated in FIG. 1A.

Figure 3:
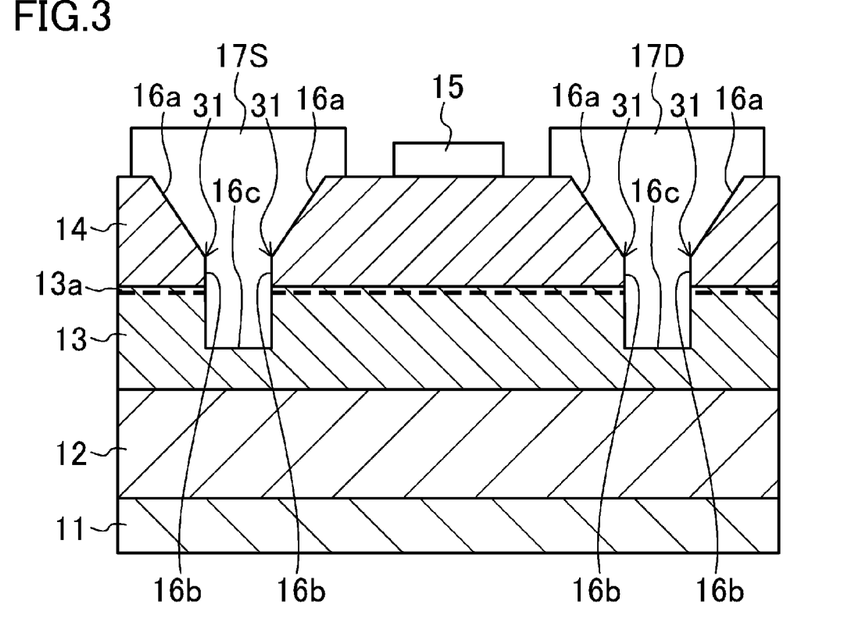
FIG. 3 is a diagram illustrating a semiconductor device according to a variation of the first embodiment.

With the configuration in FIG. 3, second contact interfaces 16b are perpendicular to the top surface of a first nitride semiconductor layer 13 (in particular, at the depth of a 2DEG layer 13a). This can further reduce the contact resistance, because the distance between a portion of each of electrodes 17 below the 2DEG layer 13a and the 2DEG layer 13a is shorter than that when the second contact interfaces 16b are inclined with respect to the top surface of the first nitride semiconductor layer 13.

Figure 4:
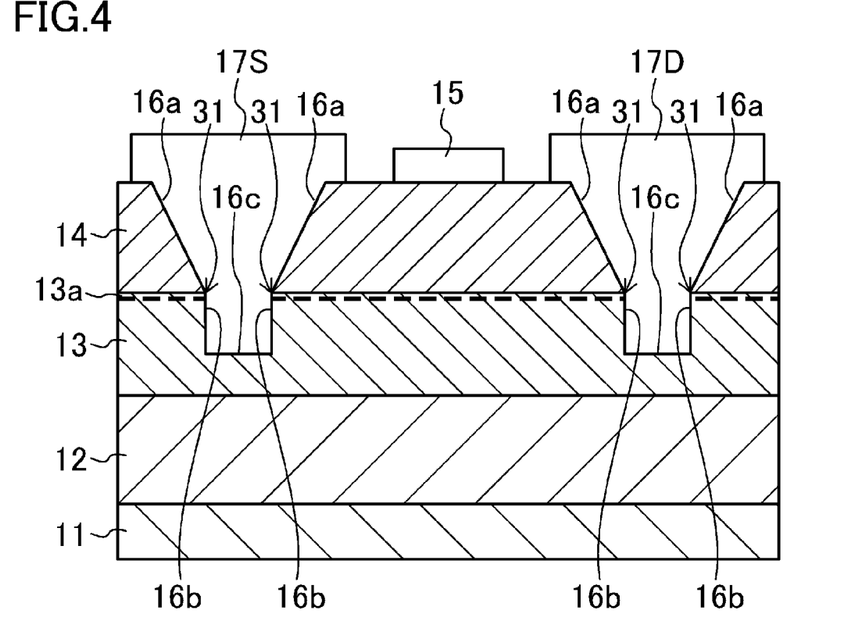
FIG. 4 is a diagram illustrating a semiconductor device according to a variation of the first embodiment.

With the configuration in FIG. 4, first contact interfaces 16a are formed to extend from the top surface of a second nitride semiconductor layer 14 and reach the bottom surface thereof (the heterojunction interface between the second nitride semiconductor layer 14 and a first nitride semiconductor layer 13). This enables utilization of the thickness of the entire second nitride semiconductor layer 14, and thus, the distance between each of the first contact interfaces 16a and a 2DEG layer 13a can be varied. This can further ensure the suitable contact resistance (e.g., most suitable contact resistance) through the second nitride semiconductor layer 14 between the 2DEG layer 13a and a corresponding one of the electrodes.

The cross section of each of the electrodes 17 illustrated in FIGS. 1A, 3, and 4 is bilaterally symmetrical, and when viewed in cross section, the second contact interfaces 16b are formed on both sides of the electrode 17. However, the cross-sectional profile of the electrode 17 is not limited to the above-described cross-sectional profile, and may be the profile illustrated in, e.g., FIG. 5. In FIG. 5, in each of electrodes 17, the depths of some of first contact interfaces 16a near a gate electrode 15 from the top surface of a second nitride semiconductor layer 14 are shallow.

Figure 5:
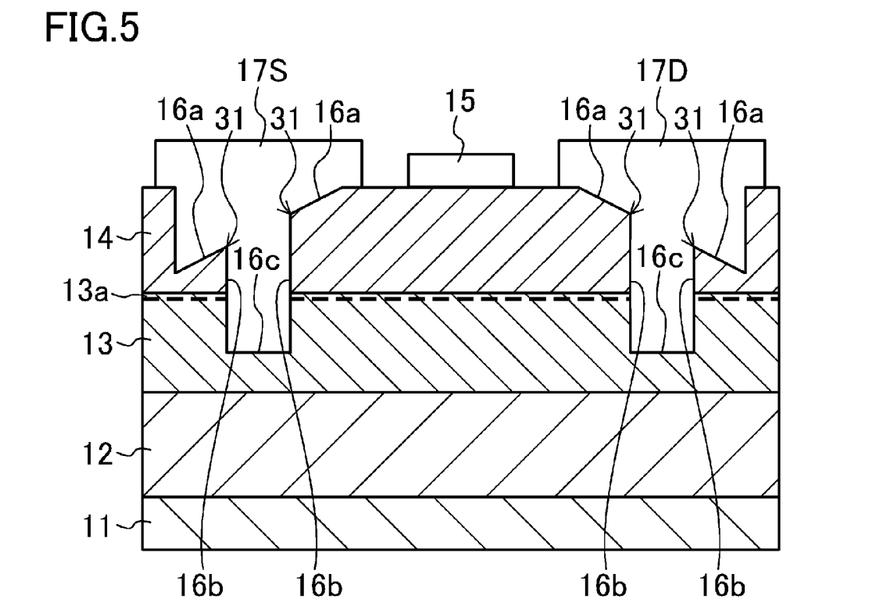
FIG. 5 is a diagram illustrating a semiconductor device according to a variation of the first embodiment.

In the configurations illustrated in FIGS. 4 and 5, the second contact interfaces 16b are perpendicular to the top surface of the first nitride semiconductor layer 13 (as in the configuration illustrated in FIG. 3); however, they are not limited to the configuration. The second contact interfaces 16b may be more steeply inclined than the first contact interfaces 16a (like the configuration illustrated in FIG. 1A).

Conductive impurities may be introduced into the second nitride semiconductor layer 14. This reduces the potential barrier at the interface between the second nitride semiconductor layer 14 and each of the electrodes 17. Therefore, the contact resistance between the second nitride semiconductor layer 14 and the ohmic electrode 17 can be further reduced.

The second nitride semiconductor layer 14 may be a layered structure including a nitride semiconductor layer into which impurities are not (intentionally) introduced, and a nitride semiconductor layer into which conductive impurities are introduced. In this case, the nitride semiconductor layer into which conductive impurities are introduced is formed on the nitride semiconductor layer into which conductive impurities are not introduced. This allows the potential barrier between the nitride semiconductor layer into which conductive impurities are introduced and each of the electrodes 17 to be small, thereby reducing the contact resistance therebetween. Furthermore, the nitride semiconductor layer into which impurities are not introduced is located on the 2DEG layer 13a to prevent interruption of the travel of electrons due to ion scattering in the 2DEG layer 13a, thereby improving the operating characteristics of the semiconductor device.

The semiconductor device 10 may further include an AlN layer. The second nitride semiconductor layer 14 more preferably has a layered structure including a plurality of aluminum gallium nitride layers, and an AlN layer is more preferably interposed between each adjacent pair of the aluminum gallium nitride layers. In this case, the aluminum gallium nitride layers between which the AlN layer is interposed may have different compositions.

An AlN layer may be formed between the first and second nitride semiconductor layers 13 and 14.

Another nitride semiconductor layer may be formed, as a cap layer, on the second nitride semiconductor layer 14.

The formation of such layers can improve the electrical characteristics of the FET (such as the sheet resistance or current collapse).

Second Embodiment

Figure 6:
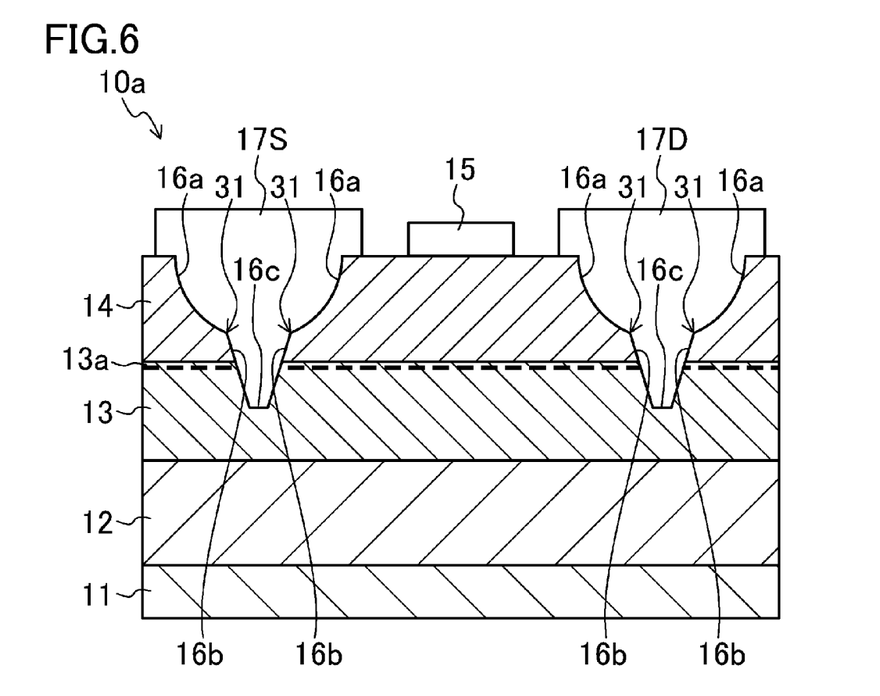
FIG. 6 is a diagram illustrating a cross-sectional configuration of an example semiconductor device (HFET) according to a second embodiment of the present disclosure.

A second embodiment of the present disclosure will be described hereinafter with reference to the drawings. FIG. 6 is a diagram schematically illustrating a cross section of an example semiconductor device 10a of this embodiment. The semiconductor device 10a is an HFET, and includes the same components as those of the semiconductor device 10 of the first embodiment, and thus, the same reference characters as those in FIG. 1A are used to represent such equivalent components. The differences of the semiconductor device 10a from the semiconductor device 10 will be principally described hereinafter.

In the semiconductor device 10a, each of electrodes 17 (a source electrode 17S and a drain electrode 17D) is in contact with a second nitride semiconductor layer 14 at least first contact interfaces 16a. The cross section of each of the first contact interfaces 16a is curved toward a first nitride semiconductor layer 13 (downward in FIG. 6). In this example, with decreasing distance from the first contact interfaces 16a to the first nitride semiconductor layer 13, the first contact interfaces 16a are more gently inclined with respect to the top surface of the first nitride semiconductor layer 13. Second contact interfaces 16b are connected at joints 31 below the first contact interfaces 16a, and the electrode 17 is in contact with a 2DEG layer 13a at the second contact interfaces 16b.

Angular portions of the second nitride semiconductor layer 14 protruding toward each of the electrodes 17 are formed at the joints 31 by the first and second contact interfaces 16a and 16b. The second contact interfaces 16b are linear when viewed in cross section, and are more steeply inclined with respect to the top surface of the first nitride semiconductor layer 13 than a lower portion of each of the first contact interfaces 16a (a portion of the first contact interface 16a near a corresponding one of the joints 31). Therefore, a surface formed by a corresponding pair of the first and second contact interfaces protrudes in a direction opposite to the first nitride semiconductor layer 13 at a corresponding one of the joints 31. The electrode 17 is bent inward in the vicinity of a corresponding one of the joints 31.

With the above-described configuration, the semiconductor device 10a has advantages similar to those of the semiconductor device 10 of the first embodiment.

First, since the first contact interfaces 16a are curved downward, the distance between each of the first contact interfaces 16a and the 2DEG layer 13a varies, and thus, a suitable contact resistance (e.g., the most suitable contact resistance) through the second nitride semiconductor layer 14 therebetween can be obtained.

Furthermore, since the second contact interface 16b is steeply inclined, this allows the distance between a portion of the second contact interface 16b below the 2DEG layer 13a and the 2DEG layer 13a to be shorter than that when the contact interface having the same profile as that of the first contact interface 16a is in contact with the 2DEG layer 13a. This can reduce the contact resistance through the first nitride semiconductor layer 13 therebetween.

Figure 7:
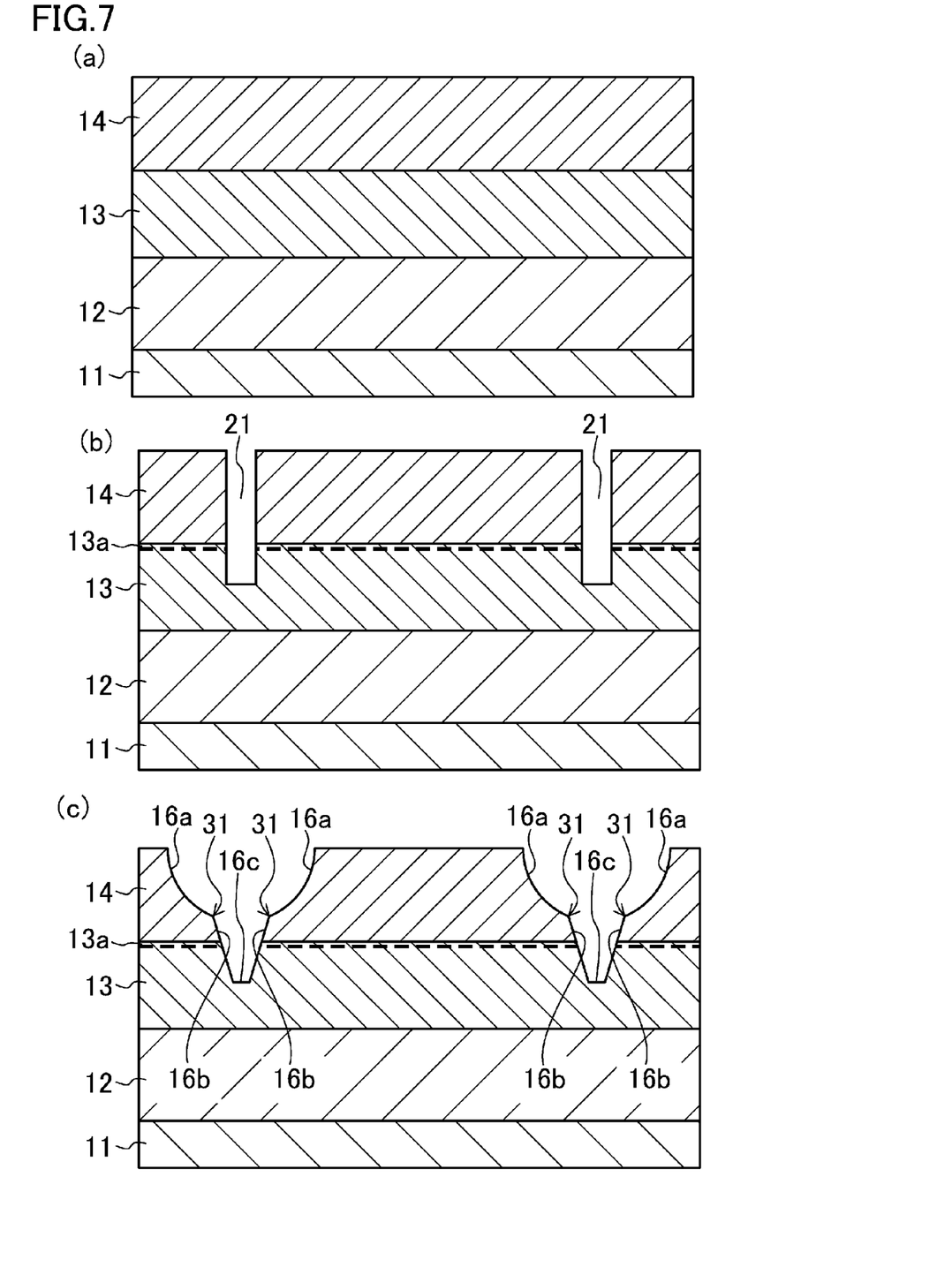
FIGS. 7A-7C are diagrams for explaining a method for fabricating the example semiconductor device according to the second embodiment.

Next, a method for fabricating a semiconductor device 10a will be described with reference to FIGS. 7A-7C illustrating process steps in the method.

First, as illustrated in FIG. 7A, a buffer layer 12 made of aluminum nitride or gallium nitride, a first nitride semiconductor layer 13 made of i-type gallium nitride, and a second nitride semiconductor layer 14 made of i-type aluminum gallium nitride ($Al_{0.26}Ga_{0.74}N$) are sequentially formed on a substrate 11 made of silicon by growth. In order to form the films, for example, MOCVD or MBE can be used.

Next, as illustrated in FIG. 7B, etching is performed by lithography and dry etching using a chlorine gas with a predetermined resist pattern (not shown) as a mask. Thus, the first and second nitride semiconductor layers 13 and 14 are etched to a depth below the 2DEG layer 13a, and two recesses 21 are formed. The bottom of each of the recesses 21 corresponds to a third contact interface 16c, and the sidewall thereof is perpendicular to the top surface of the first nitride semiconductor layer 13. The recesses 21 are a predetermined distance apart from each other to correspond to a source electrode 17S and a drain electrode 17D.

Next, as illustrated in FIG. 7C, etching is performed by lithography and dry etching using a chlorine gas with a predetermined resist pattern (not shown) as a mask. Thus, portions of the second nitride semiconductor layer 14 are removed to form first contact interfaces 16a each having a cross-sectional profile curved toward the first nitride semiconductor layer 13. Simultaneously, parts of the first nitride semiconductor layer 13 and parts of the second nitride semiconductor layer 14 both surrounding lower portions of the recesses 21 are removed to obtain inclined second contact interfaces 16b.

In order to obtain such a shape, the conditions for dry etching may be determined to principally perform isotropic chemical etching. More specifically, for example, the gas pressure may be increased, or the bias power to be applied to a sample may be reduced.

Instead of dry etching, wet etching using, e.g., acid or alkali may be performed.

Next, electrodes 17 (a source electrode 17S and a drain electrode 17D) and a gate electrode 15 are formed, thereby fabricating the semiconductor device 10a in FIG. 6. This process step may be performed in a manner similar to that described in the first embodiment.

(Variations)

Next, other example configurations of each of the cross-sectional profiles formed by first and second contact interfaces 16a and 16b which are ohmic contact regions will be described with reference to FIGS. 8-10. All of the configurations reduce the contact resistance similarly to the semiconductor device 10a illustrated in FIG. 6.

Figure 8:
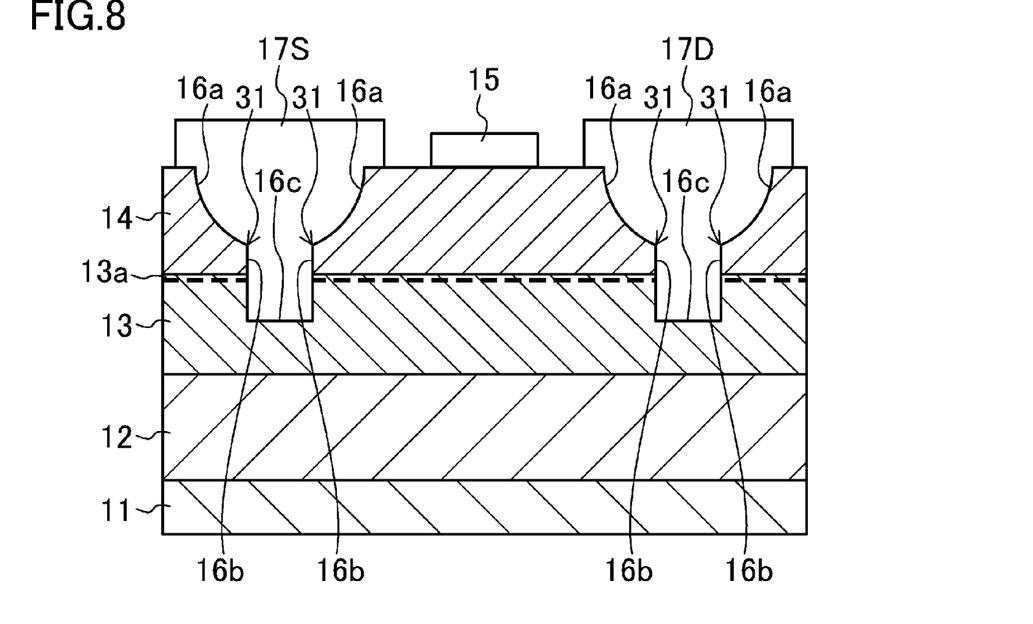
FIG. 8 is a diagram illustrating a semiconductor device according to a variation of the second embodiment.

With the configuration in FIG. 8, the second contact interfaces 16b are perpendicular to the top surface of a first nitride semiconductor layer 13 (in particular, at the depth of a 2DEG layer 13a). This can further reduce the contact resistance, because the distance between the 2DEG layer 13a and a portion of each of electrodes 17 below the 2DEG layer 13a is shorter than that when the second contact interfaces 16b are inclined with respect to the top surface of the first nitride semiconductor layer 13.

Figure 9:
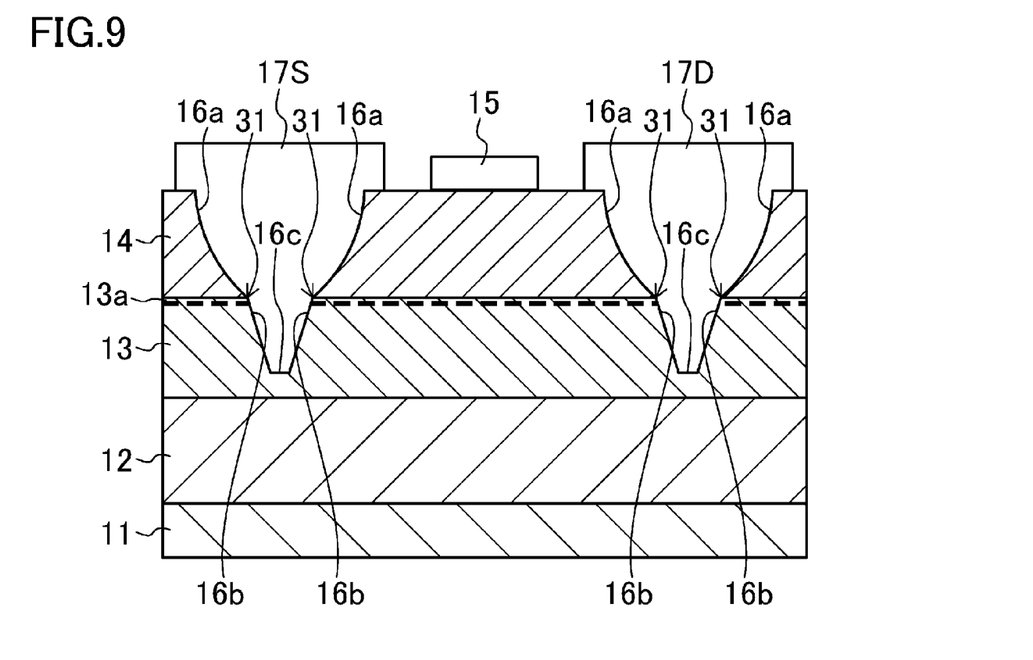
FIG. 9 is a diagram illustrating a semiconductor device according to a variation of the second embodiment.

With the configuration in FIG. 9, the first contact interfaces 16a are formed to extend from the top surface of a second nitride semiconductor layer 14 and reach the bottom surface thereof (the heterojunction interface between the second nitride semiconductor layer 14 and a first nitride semiconductor layer 13). In other words, joints 31 between the first and second contact interfaces 16a and 16b are located at the same level as the level of the heterojunction interface. This enables utilization of the thickness of the entire second nitride semiconductor layer 14, and the distance between each of the first contact interfaces 16a and a 2DEG layer 13a can be varied. This can further ensure the suitable contact resistance (e.g., the most suitable contact resistance) through the second nitride semiconductor layer 14 between the 2DEG layer 13a and a corresponding one of the electrodes.

Figure 10:
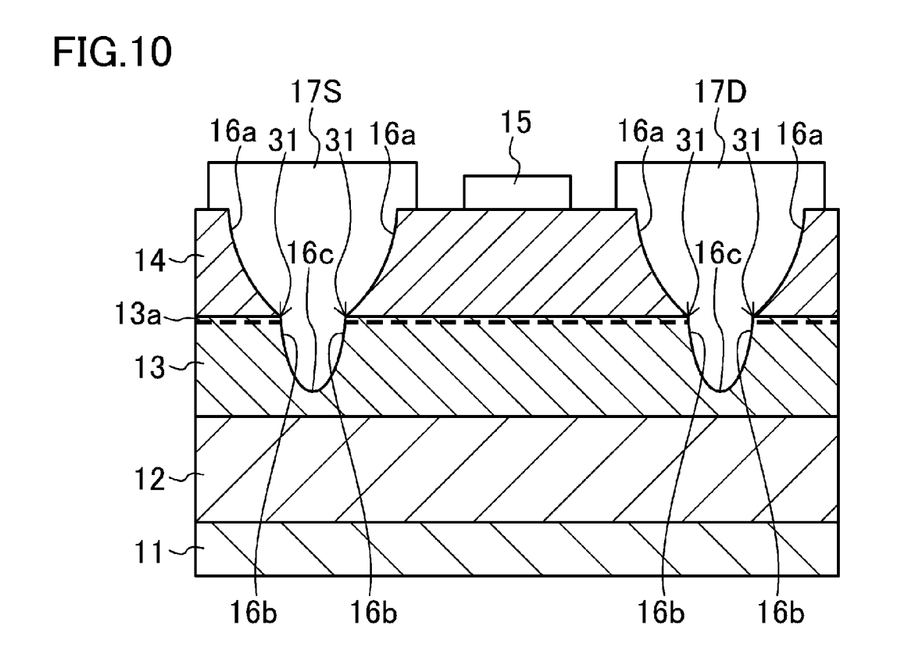
FIG. 10 is a diagram illustrating a semiconductor device according to a variation of the second embodiment.

With the configuration in FIG. 10, the second contact interface 16b each have a cross-sectional profile curved toward the substrate 11 (downward in FIG. 10). However, the second contact interfaces 16b are more steeply inclined than the first contact interfaces 16d in the vicinity of joints 31. Even with such a profile, an advantage of this embodiment, i.e., a reduction in the contact resistance, is achieved.

Like the first embodiment, conductive impurities may be introduced into the second nitride semiconductor layer 14, and the second nitride semiconductor layer 14 may be a layered structure including a nitride semiconductor layer into which impurities are not introduced, and a nitride semiconductor layer into which impurities are introduced. The semiconductor device 10a may include an AlN layer.

Figure 11:
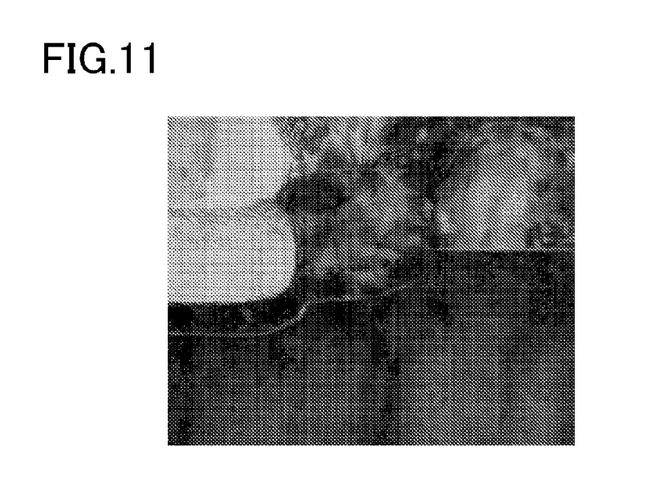
FIG. 11 is a transmission electron microscopy (TEM) photograph illustrating a cross section of an ohmic electrode of the example semiconductor device according to the second embodiment.

FIG. 11 illustrates a transmission electron microscope (TEM) photograph of a cross section of one of the electrodes 17 in the example configuration in FIG. 10. The breadth of this photograph corresponds to about 300 nm.

Figure 12:
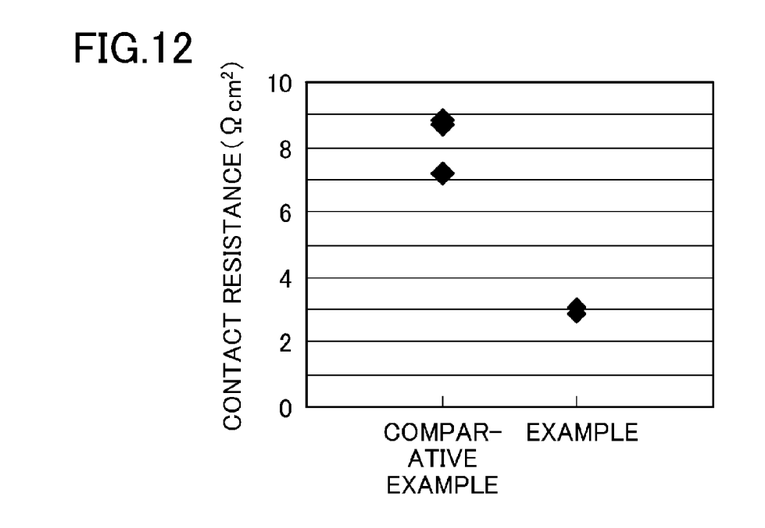
FIG. 12 is a diagram illustrating contact resistances of a semiconductor device according to an example of the present disclosure, and contact resistances of a semiconductor device according to a comparative example.

FIG. 12 illustrates contact resistances in the configuration in FIG. 10 and contact resistances in the comparative example. In the comparative example, the entire sidewalls of recesses in which electrodes 17 are formed are inclined at the same angle as illustrated in FIG. 1C. As illustrated in FIG. 12, the contact resistances in the configuration in FIG. 10 are equal to or lower than half of each of the contact resistances in the comparative example.

Third Embodiment

Figure 13:
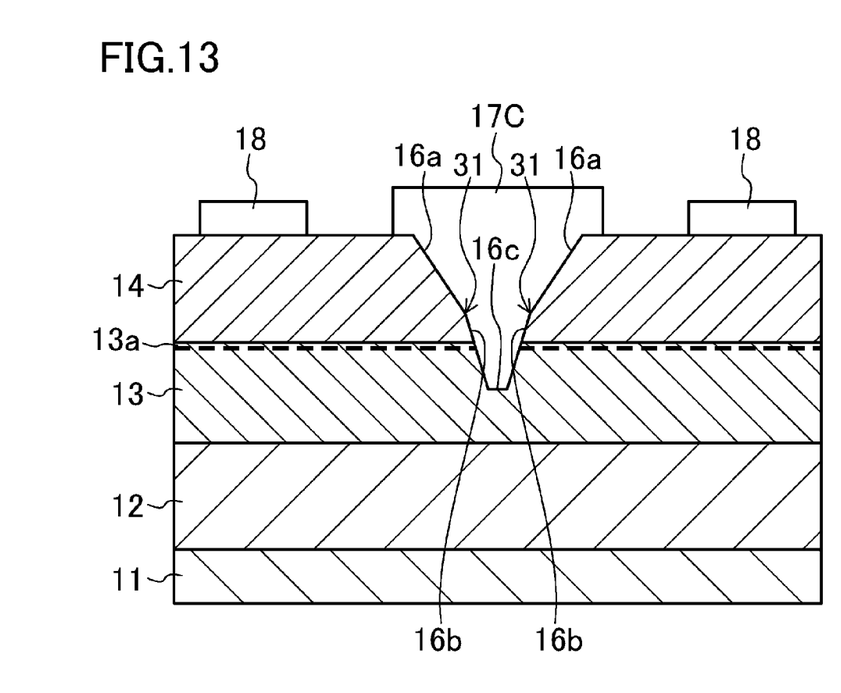
FIG. 13 is a diagram illustrating a cross-sectional configuration of an example semiconductor device (SBD) according to a third embodiment of the present disclosure.

A third embodiment of the present disclosure will be described hereinafter with reference to the drawings. FIG. 13 is a diagram schematically illustrating a cross section of an example semiconductor device 10b of this embodiment.

The semiconductor device 10b includes the same components as those of the semiconductor device 10 of the first embodiment, and thus, the same reference characters as those in FIG. 1A are used to represent such equivalent components. The differences of the semiconductor device 10b from the semiconductor device 10 will be principally described hereinafter.

While the semiconductor device 10 of the first embodiment is an HFET, the semiconductor device 10b of this embodiment is a Schottky barrier transistor (SBT). Therefore, a cathode electrode 17C which is an ohmic electrode having a structure similar to that of an electrode 17 (the source electrode 17S or the drain electrode 17D) of the semiconductor device 10 is formed. Anode electrodes 18 are formed laterally outward from the cathode electrode 17C to be in Schottky contact with a second nitride semiconductor layer 14. The anode electrodes 18 are each made of, for example, a multi-layer film of nickel (Ni) and gold (Au).

Such a structure of the semiconductor device 10b including the cathode electrode 17C which is an ohmic electrode also provides the 2DEG concentration and the contact resistance which depend on a variation in the distance between each of first contact interfaces 16a and a 2DEG layer 13a. Therefore, the suitable contact resistance (e.g., the most suitable contact resistance) through the second nitride semiconductor layer 14 therebetween can be obtained. Second contact interfaces 16b are more steeply inclined with respect to the top surface of a first nitride semiconductor layer 13 than the first contact interfaces 16a at the depth of the 2DEG layer 13a. This reduces the distance between a portion of the cathode electrode 17C below the 2DEG layer 13a and the 2DEG layer 13a, thereby reducing the contact resistance through the first nitride semiconductor layer 13 therebetween.

The cathode electrode 17C may have a structure similar to that of any one of the variations of the first embodiment, the second embodiment, the variations of the second embodiment (the semiconductor devices illustrated in FIGS. 3-6 and 8-10) instead of a structure similar to that of the first embodiment (each of the electrodes 17 in FIG. 1A).

The semiconductor device of the present disclosure can reduce the contact resistance between an electrode and a nitride semiconductor layer, and thus, is useful as a semiconductor device, such as an HFET or an SBT.

What is claimed is:

1. A semiconductor device comprising:
a first nitride semiconductor layer;
a second nitride semiconductor layer formed on the first nitride semiconductor layer, and having a larger band gap than the first nitride semiconductor layer; and
an ohmic electrode formed to fill a recess which passes through the second nitride semiconductor layer, and is formed such that the first nitride semiconductor layer is recessed, wherein
a two-dimensional electron gas layer is formed in a portion of the first nitride semiconductor layer immediately below an interface between the first and second nitride semiconductor layers,
the ohmic electrode and the second nitride semiconductor layer are in contact with each other at least a first contact interface being a portion of a side surface of the recess,
the ohmic electrode and a portion of the first nitride semiconductor layer corresponding to the two-dimensional electron gas layer are in contact with each other at least a second contact interface being a portion of the side surface of the recess and connected below the first contact interface,
the first contact interface is formed such that a width of the recess increases from a lower surface of the second nitride semiconductor layer to an upper surface thereof, and
the second contact interface is more steeply inclined with respect to a top surface of the first nitride semiconductor layer than the first contact interface in a vicinity of a joint between the first and second contact interfaces.

2. The semiconductor device of claim 1, wherein
the first contact interface has a plane forming a predetermined angle with respect to the top surface of the first nitride semiconductor layer, and
the second contact interface has a plane forming a steeper angle with respect to the top surface of the first nitride semiconductor layer than the predetermined angle.

3. The semiconductor device of claim 1, wherein
at least one portion of the first contact interface is curved toward the second nitride semiconductor layer.

4. The semiconductor device of claim 1, wherein
the second contact interface is perpendicular to the top surface of the first nitride semiconductor layer.

5. The semiconductor device of claim 1, wherein
at least one portion of the second contact interface is curved toward the first nitride semiconductor layer.

6. The semiconductor device of claim 1, wherein
the first contact interface is formed to extend from the upper surface of the second nitride semiconductor layer and reach the lower surface thereof.

7. The semiconductor device of claim 1, wherein
the second nitride semiconductor layer has a layered structure made of a plurality of different nitride semiconductor layers.

8. The semiconductor device of claim 1, wherein
the second nitride semiconductor layer includes a third nitride semiconductor layer into which conductive impurities are introduced.

9. The semiconductor device of claim 8, wherein
the second nitride semiconductor layer includes a fourth nitride semiconductor layer into which impurities are not introduced, and
the third nitride semiconductor layer is formed on the fourth nitride semiconductor layer.

10. The semiconductor device of claim 1, wherein
an AlN layer is formed between the first and second nitride semiconductor layers.

11. The semiconductor device of claim 1, wherein
the ohmic electrode includes two ohmic electrodes spaced apart from each other, and
a gate electrode is formed on a region of the second nitride semiconductor layer between the two ohmic electrodes.

12. The semiconductor device of claim 1 further comprising:
an anode electrode formed at a location different from a location of the ohmic electrode, and being in Schottky contact with the second nitride semiconductor layer.

13. The semiconductor device of claim 1, wherein
a portion of the second contact interface is below the two-dimensional electron gas layer.

* * * * *